(12) United States Patent
Hsu

(10) Patent No.: US 8,460,594 B2
(45) Date of Patent: Jun. 11, 2013

(54) INJECTION MOLDING METHOD

(75) Inventor: Chia-Ling Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 202 days.

(21) Appl. No.: 13/077,916

(22) Filed: Mar. 31, 2011

(65) Prior Publication Data

US 2012/0187601 A1    Jul. 26, 2012

(30) Foreign Application Priority Data

Jan. 25, 2011   (TW) .............................. 100102583 A

(51) Int. Cl.
*B29C 33/56*   (2006.01)
*B29C 45/83*   (2006.01)

(52) U.S. Cl.
USPC ...................................... 264/328.1; 264/338

(58) Field of Classification Search
USPC ............................................... 264/328.1, 338
See application file for complete search history.

(56) References Cited

U.S. PATENT DOCUMENTS

| 5,587,105 | A  | * | 12/1996 | Sheppard et al. | ........ | 252/183.11 |
| 7,687,007 | B2 | * | 3/2010 | Ling et al. | ...................... | 264/338 |
| 2002/0130441 | A1 | * | 9/2002 | Robinson et al. | ............. | 264/442 |
| 2003/0020210 | A1 | * | 1/2003 | Robinson et al. | ............. | 264/236 |
| 2005/0206040 | A1 | * | 9/2005 | Mercado | ....................... | 264/338 |
| 2009/0068475 | A1 | * | 3/2009 | Bosshammer | ................ | 428/447 |
| 2012/0280430 | A1 | * | 11/2012 | Jones | ............................ | 264/400 |

* cited by examiner

*Primary Examiner* — Jill Heitbrink
(74) *Attorney, Agent, or Firm* — Altis Law Group, Inc.

(57) ABSTRACT

An injection molding method includes: providing a mold core which defines a mold cavity, depositing a lubrication layer on an inner surface of the mold cavity, injecting plastic material into the mold cavity, and molding the plastic material into the plastic element.

18 Claims, 2 Drawing Sheets

Providing a mold core having a mold cavity, the mold cavity including an inner surface — 200

Depositing a lubrication layer on the inner surface — 202

Injecting plastic material into the mold cavity, and molding the plastic material into a plastic element — 204

INJECTION MOLDING METHOD

BACKGROUND

1. Technical Field

The present disclosure relates to injection molding, and particularly, to an injection molding method including depositing a lubrication layer on an inner surface of a mold core using an atomic layer deposition process.

2. Description of Related Art

Plastic elements having fine and complicated structure are generally manufactured by injection molding. Polyetherimide (PEI) resin, due to its excellent mechanical properties, high light-transmittance and outstanding thermal stability, has been widely used for manufacturing optical fiber connectors. However, molten PEI resin has poor fluidity. That means, in manufacturing, a mold cavity may not be completely filled with the molten PEI resin. To solve this problem, high pressure is generally applied into the mold cavity to improve the flow speed of the molten PEI resin, which can shorten the lifetime of a corresponding injection molding machine. Therefore, providing an injection molding to ensure plastic elements quality and avoid harming the injection molding machine is desired.

BRIEF DESCRIPTION OF THE DRAWING

Many aspects of the present disclosure can be better understood with reference to the following drawing. The components in the drawings are not necessarily drawn to scale, the emphasis instead being placed upon clearly illustrating the principles of the present disclosure.

DETAILED DESCRIPTION

Figure 1:
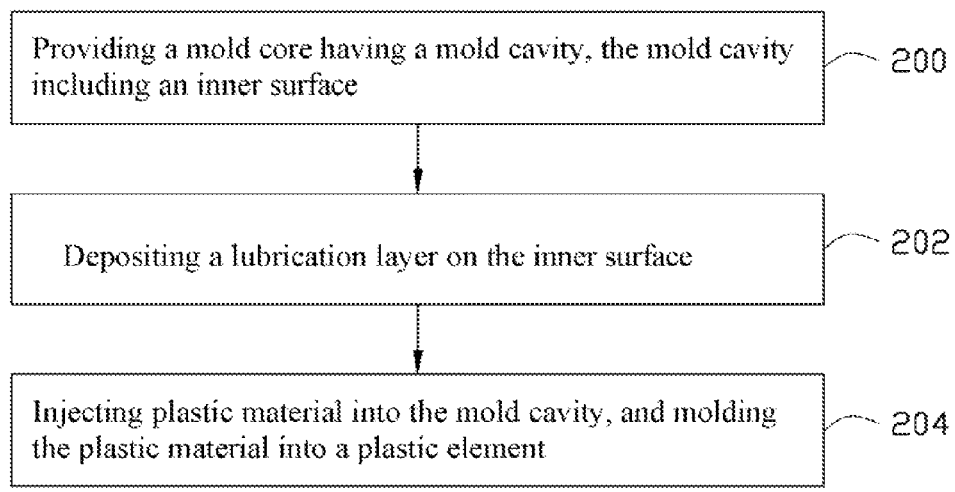
FIG. 1 is a schematic view of an exemplary embodiment of an injection molding method.

Embodiments of the present disclosure will now be described in detail and with reference to the drawing.

Referring to FIG. 1, an exemplary embodiment of a method for injection molding a plastic element is provided. The method includes the following steps.

Figure 2:
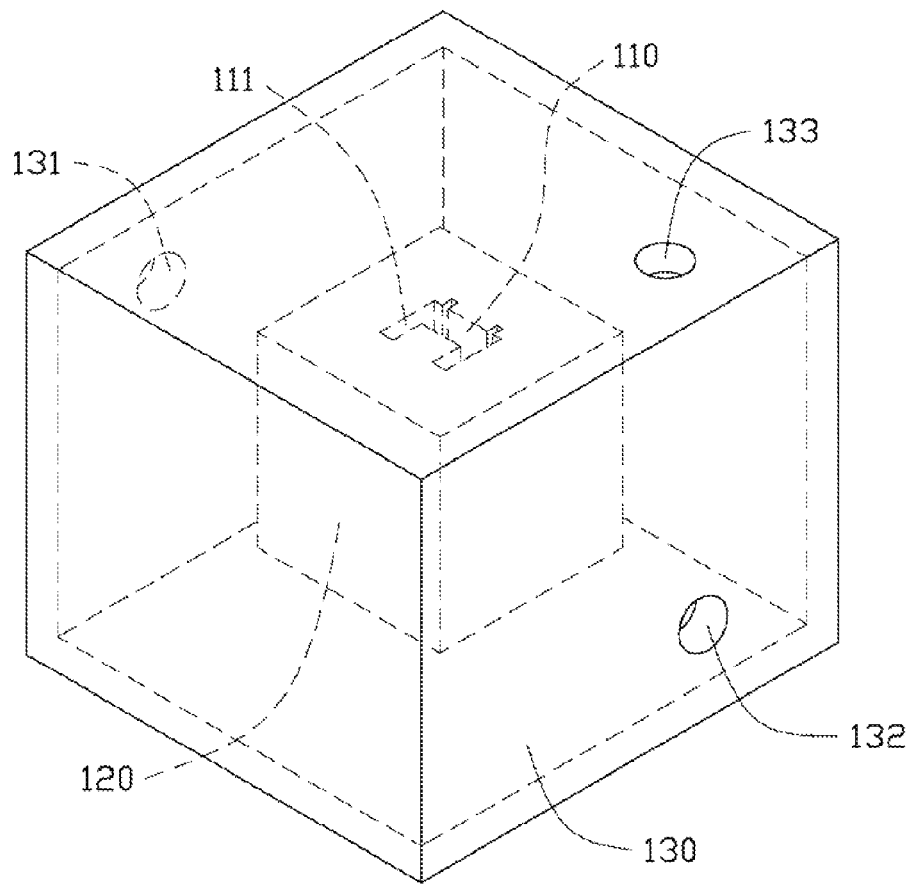
FIG. 2 shows a mold core in a coating chamber according to one embodiment.

In step 200, a mold core is provided, wherein the mold core defines a mold cavity. Referring to FIG. 2, in one embodiment, a mold core 120 is provided. The mold core 120 is used for molding an optical fiber connector using polyetherimide (PEI) resin. The mold core 120 defines a mold cavity 110. The mold cavity 110 has an inner surface 111.

In step 202, a lubrication layer is positioned on an inner surface of the mold cavity. In one embodiment, the lubrication layer is comprised of titanium nitride (TiN) and is formed on the inner surface 111 using an atomic layer deposition process. In detail, the mold core 120 is positioned in a coating chamber 130. The coating chamber 130 includes a gas inlet 131, a gas outlet 132 and an exhaust opening 133. The coating chamber 130 is exhausted to vacuum phase, and then heated to a predetermined temperature. A first reactive gas is introduced into the coating chamber 130. In the present embodiment, an organically metallic gas containing Ti, such as $TiCl_4$, $Ti(N(CH_3)_2)_4$, $Ti(N(C_2H_5)_2)_4$, and $Ti(N(CH_3)(C_2H_5))_4$, is employed as the first reactive gas. The predetermined temperature is equal to the thermal decomposition temperature of the first reactive gas. As such, the first reactive gas thermally decomposes, generating an ion layer containing $Ti^{4+}$ absorbed on the inner surface 111. For improving uniformity, prior to decomposing the first reactive gas, an activation process is applied to the inner surface 111 to enhance adhesive force between the inner surface 111 and the ion layer. In one embodiment, the inner surface 111 is finely corroded with an etchant such that pluralities of pores are formed in the inner surface 111. In other embodiments, the inner surface 111 is corroded using an electrochemical process.

A small amount of the first reactive gas might remain. Under this situation, the remaining first reactive gas is exhausted out of the coating chamber 130. Then, a second reactive gas, such as nitrogen gas ($N_2$) or ammonia gas ($NH_3$), is introduced into the coating chamber 130. The second reactive gas reacts with the ion layer, thereby forming the lubrication layer on the inner surface 111.

In step 204, plastic material is injected into the mold cavity and molded into a plastic element. The PEI resin is fed into the mold cavity 110 and molded into the optical fiber connector.

In the present embodiment, molten PEI resin flows quicker on the lubrication layer than on the inner surface 111. Therefore, the mold cavity 110 can be completely filled. Additionally, the lubrication layer formed with the atomic layer deposition process is atomic-class thick, avoiding diminishing the size of the plastic element. Furthermore, the atomic layer deposition process is adapted for forming a coating layer on any mold core even having complicated and fine structure, ensuring plastic element quality.

The described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A method for injection molding a plastic element, the method comprising:
   providing a mold core, the mold core defining a mold cavity, the mold cavity comprising an inner surface;
   depositing a lubrication layer by using an atomic layer deposition process on the inner surface;
   injecting plastic material into the mold cavity; and
   molding the plastic material into the plastic element.

2. The method of claim 1, further comprising activating the inner surface prior to depositing the lubrication layer.

3. The method of claim 1, wherein depositing the lubrication layer by using the atomic layer deposition process on the inner surface comprises:
   positioning the mold core in a vacuum chamber;
   heating the vacuum chamber to a predetermined temperature;
   introducing a first reactive gas into the vacuum chamber to form an ion layer on the inner surface; and
   introducing a second reactive gas into the vacuum chamber such that the second reactive gas reacts with the ion layer thereby obtaining the lubrication layer on the inner surface.

4. The method of claim 3, wherein depositing the lubrication layer by using the atomic layer deposition process on the inner surface further comprises exhausting remaining first reactive gas prior to introducing the second reactive gas into the vacuum chamber.

5. The method of claim 3, wherein depositing the lubrication layer on the inner surface by using the atomic layer deposition process comprises exhausting remaining second reactive gas after obtaining the lubrication layer.

6. The method of claim 1, wherein the plastic material is comprised of PEI resin.

7. The method of claim 3, wherein the first reactive gas comprises an organically metallic gas containing Ti.

8. The method of claim 7, wherein the first reactive gas is selected from the group consisting of $TiCl_4$, $Ti(N(CH_3)_2)_4$, $Ti(N(C_2H_5)_2)_4$, and $Ti(N(CH_3)(C_2H_5))_4$.

9. The method of claim 7, wherein the second reactive gas comprises nitrogen gas.

10. The method of claim 7, wherein the second reactive gas comprises ammonia gas.

11. A method for injection molding a plastic element, the method comprising:
provonding a mold core, the mold core defining a mold cavity, the mold cavity comprising an inner surface;
depositing a lubrication layer on the inner surface, comprising:
positioning the mold core in a vacuum chamber;
heating the vacuum chamber to a predetermined temperature;
introducing a first reactive gas selected from the group consisting of $TiCl_4$, $Ti(N(CH_3)_2)_4$, $Ti(N(C_2H_5)_2)_4$, and $Ti(N(CH_3)(C_2H_5))_4$ into the vacuum chamber to form an ion layer on the inner surface; and
introducing a second reactive gas into the vacuum chamber such that the second reactive gas reacts with the ion layer thereby obtaining the lubrication layer on the inner surface;
injecting plastic material into the mold cavity; and
molding the plastic material into the plastic element.

12. The method of claim 11, further comprising activating the inner surface prior to depositing the lubrication layer by using an atomic layer deposition process on the inner surface.

13. The method of claim 11, wherein the lubrication layer is comprised of titanium nitride (TiN) and is formed on the inner surface using an atomic layer deposition process.

14. The method of claim 11, wherein depositing the lubrication layer on the inner surface comprises exhausting remaining first reactive gas prior to introducing the second reactive gas into the vacuum chamber.

15. The method of claim 11, wherein depositing the lubrication layer on the inner surface comprises exhausting remaining second reactive gas after obtaining the lubrication layer.

16. The method of claim 11, wherein the plastic material is comprised of PEI resin.

17. The method of claim 11, wherein the second reactive gas comprises nitrogen gas.

18. The method of claim 11, wherein the second reactive gas comprises ammonia gas.

* * * * *